United States Patent
Liu

(10) Patent No.: US 10,418,421 B2
(45) Date of Patent: Sep. 17, 2019

(54) SILICON-BASED OLED IMAGE TRANSCEIVING DEVICE AND MANUFACTURE METHOD THEREOF

(71) Applicant: SHENZHEN DIANBOND TECHNOLOGY CO., LTD, Shenzhen, Guangdong (CN)

(72) Inventor: Ping Liu, Guangdong (CN)

(73) Assignee: SHENZHEN DIANBOND TECHNOLOGY CO., LTD, Shenzhen, Guangdong (CN)

( * ) Notice: Subject to any disclaimer, the term of this patent is extended or adjusted under 35 U.S.C. 154(b) by 0 days.

(21) Appl. No.: 15/958,890

(22) Filed: Apr. 20, 2018

(65) Prior Publication Data

US 2018/0240851 A1 Aug. 23, 2018

Related U.S. Application Data

(63) Continuation of application No. PCT/CN2015/095512, filed on Nov. 25, 2015.

(30) Foreign Application Priority Data

Oct. 20, 2015 (CN) .......................... 2015 1 0684007

(51) Int. Cl.
*H01L 27/32* (2006.01)
*H01L 51/50* (2006.01)
(Continued)

(52) U.S. Cl.
CPC ...... *H01L 27/3211* (2013.01); *H01L 27/3227* (2013.01); *H01L 27/3234* (2013.01);
(Continued)

(58) Field of Classification Search
None
See application file for complete search history.

(56) References Cited

U.S. PATENT DOCUMENTS

2008/0054276 A1 3/2008 Vogel et al.
2010/0201275 A1 8/2010 Cok et al.
(Continued)

FOREIGN PATENT DOCUMENTS

CN 1766723 A 5/2006
CN 101252101 A 8/2008
(Continued)

OTHER PUBLICATIONS

International Search Report (English and Chinese) and Written Opinion issued in PCT/CN2015/095512 dated Jul. 26, 2016, 9 pages.
(Continued)

*Primary Examiner* — Michelle Mandala
(74) *Attorney, Agent, or Firm* — Hamre, Schumann, Mueller & Larson, P.C.

(57) ABSTRACT

A silicon-based OLED image transceiving device includes a substrate, multiple photodiodes for sensing light, and multiple OLEDs for emitting light. The OLED includes a metal interconnect anode, a hole transport layer, an organic light emitting layer, an electronic transport layer, and a transparent cathode layer. The hole transport layer, the organic light emitting layer, the electronic transport layer, and the transparent cathode layer are sequentially formed on the metal interconnect anode. The organic light emitting layer is only located on an area corresponding to the metal interconnect anode, and does not extend to an area corresponding to the photodiode. The multiple photodiodes and organic light emitting layers of the multiple OLEDs are arranged to form a pixel matrix of the image transceiving device. The silicon-based OLED image transceiving device has relatively high sensitivity of the photodiode.

6 Claims, 3 Drawing Sheets

(51) Int. Cl.
 *H01L 51/52* (2006.01)
 *H01L 51/56* (2006.01)
(52) U.S. Cl.
 CPC ...... *H01L 51/5012* (2013.01); *H01L 51/5056* (2013.01); *H01L 51/5072* (2013.01); *H01L 51/5218* (2013.01); *H01L 51/5234* (2013.01); *H01L 51/56* (2013.01)

(56) References Cited

U.S. PATENT DOCUMENTS

2013/0313533 A1    11/2013  Sung
2015/0331508 A1*   11/2015  Nho ..................... G06F 3/0421
                                                                  345/173

FOREIGN PATENT DOCUMENTS

| CN | 101609647 A | 12/2009 |
| CN | 102983154 A | 3/2013 |
| CN | 103022076 A | 4/2013 |
| CN | 103337503 A | 10/2013 |
| CN | 104377315 A | 2/2015 |

OTHER PUBLICATIONS

Office Action issued in CN201510684007.4 dated Sep. 11, 2017, with English translation; 17 pages.

\* cited by examiner

SILICON-BASED OLED IMAGE TRANSCEIVING DEVICE AND MANUFACTURE METHOD THEREOF

CROSS REFERENCE TO RELATED APPLICATION

This application is a continuation application of PCT/CN2015/095512, filed on Nov. 25, 2015. The contents of PCT/CN2015/095512 are all hereby incorporated by reference.

TECHNICAL FIELD

The present application relates to OLED display technologies, and in particular, to a silicon-based OLED image transceiving device and a manufacture method thereof.

BACKGROUND

An organic light emitting device (OLED) has advantages such as high brightness, low driving voltage, rapid response speed, unlimited viewing angle, low power consumption, ultra-thinness and ultra-lightness, unlimited shape, color output with a single color of red or green or blue or white, and long service life, and has a huge application prospect in fields such as displays. An OLED image transceiving device combined with a silicon-based CMOS drive circuit may integrate functions such as image display, image capture, and signal processing and control.

In an OLED image transceiving device with an image transceiving function, a photodiode is placed near and is separated from an OLED light emitting source, and both an OLED display function and an image sensor function can be integrated. The existing OLED image transceiving device has a problem of low sensitivity. On the other hand, the maximum area of a typical OLED image transceiving device is determined by an exposure field, and generally is far less than the area of a silicon wafer. Therefore, hundreds of OLED image transceiving devices can be manufactured on one silicon wafer. High-resolution and large-area display and imaging may be applied in different fields. At present, a main exposure method is step-by-step or scanning exposure. As the size of the OLED image transceiving device gradually increases, an effective exposure area of a stepping exposure machine is limited, and an effective area of a mask plate cannot cover an entire effective area. Therefore, how to expose an OLED image transceiving device above 1.2 inches is a technical problem to be resolved.

SUMMARY

The technical problem to be resolved in the embodiments of the present application is to provide a silicon-based OLED image transceiving device and a manufacture method thereof to make up the deficiency of the prior art, so that the OLED image transceiving device has relatively high sensitivity.

The technical problem of the embodiments of the present application is solved by using the following technical solutions:

A silicon-based OLED image transceiving device comprises a substrate, multiple photodiodes for sensing light, and multiple OLEDs for emitting light, where the OLED comprises a metal interconnect anode, a hole transport layer, an organic light emitting layer, an electronic transport layer, and a transparent cathode layer; the hole transport layer, the organic light emitting layer, the electronic transport layer, and the transparent cathode layer are sequentially formed on the metal interconnect anode; the organic light emitting layer is only located on an area corresponding to the metal interconnect anode, and does not extend to an area corresponding to the photodiode; and the multiple photodiodes and organic light emitting layers of the multiple OLEDs are arranged to form a pixel matrix of the image transceiving device.

A manufacture method of a silicon-based OLED image transceiving device comprises steps of forming a photodiode and an OLED on a substrate, where in the step of forming an OLED, a hole transport layer, an organic light emitting layer, an electronic transport layer, and a transparent cathode layer are sequentially formed on a metal interconnect anode; the organic light emitting layer is only located on an area corresponding to the metal interconnect anode, and does not extend to an area corresponding to the photodiode; and multiple photodiodes and organic light emitting layers of multiple OLEDs are arranged to form a pixel matrix of the image transceiving device.

Compared with the prior art, the embodiments of the present application may have the following beneficial effects:

In the silicon-based OLED image transceiving device and the manufacture method thereof in the embodiments of the present application, because an organic light emitting layer is only located on an area of a metal interconnect anode of an OLED, and there is no light emitting layer on an area corresponding to a photodiode, attenuation of incident light by the OLED may be reduced, thereby improving the sensitivity of the photodiode. In a preferable solution, the OLED comprises a red-light OLED, a green-light OLED, and a blue-light OLED. Therefore, no color filter or glass cover encapsulation is needed subsequently, and thin film encapsulation is directly used to cover the OLED for protection, thereby improving the light emitting efficiency of the OLED, further improving the sensitivity of the photodiode, simplifying the process, and improving the reliability.

DETAILED DESCRIPTION

The present application is further described in detail below with reference to embodiments and the accompanying drawings.

Embodiment 1

This embodiment provides an OLED image transceiving device that integrates photodiodes as light sensing units. The device comprises a silicon substrate, multiple photodiodes for sensing light, and multiple OLEDs for emitting light.

Figure 1:
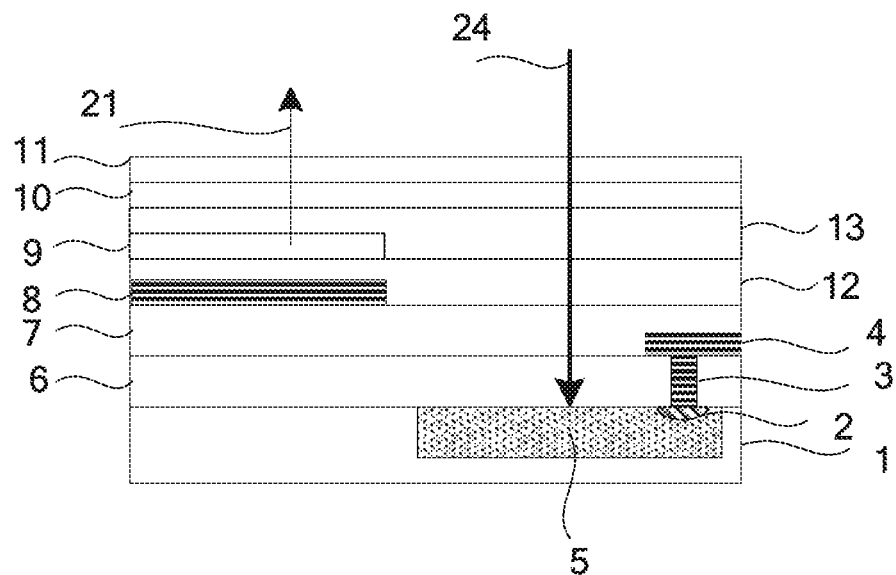
FIG. 1 is a schematic sectional view of a light emitting sub-pixel and a light sensing unit in an OLED image transceiving device according to embodiment 1 of the present application.

As shown in FIG. 1, FIG. 1 is a schematic sectional view of a light emitting sub-pixel and a light sensing unit in a pixel in the OLED image transceiving device according to the present embodiment. An n-well 5 is formed on a p-Si substrate 1, and the p-Si substrate 1 and the n-well 5 form a photodiode. An insulating interlayer 6 continues to be formed, and a plug 3 is formed on the insulating interlayer. The n-well 5 is connected to a contact 2, and is connected to a metal interconnect 4 by the plug 3. The metal interconnect 4 is formed on the insulating interlayer 6. An inter-metallic insulating layer 7 is formed on the insulating interlayer 6 and the metal interconnect 4. A metal interconnect anode 8 is formed on the inter-metallic insulating layer 7, and the metal interconnect anode 8 is connected to a drain electrode (not shown in the figure) of a field effect transistor by using the plug. The metal interconnect anode 8 is used as a reflective anode of an OLED.

The OLED comprises the metal interconnect anode 8, a hole transport layer 12, an organic light emitting layer 9, an electronic transport layer 13, and a transparent cathode layer 10. Materials of the metal interconnect anode 8 may be silver, gold, chromium, aluminum, copper, molybdenum, tantalum, wolfram, and the like or various alloys formed by these materials. Layers of structures are sequentially formed on the metal interconnect anode 8. The organic light emitting layer 9 is located on an area in which the metal interconnect anode 8 is located. A transparent conducting layer is formed on the electronic transport layer 13 and used as the transparent cathode layer 10. The transparent conducting layer may be a transparent conducting film such as ITO or IZO, or may be a transparent conducting layer formed by a thin metal film.

When a voltage is applied to the anode and cathode of the OLED, light is emitted from the organic light emitting layer 9. A part of the light becomes output light 21, and incident light 24 is not blocked and may be detected by the photodiode. Because the light emitting layer is only located on an anode area of the OLED, and there is no light emitting layer on the photodiode, attenuation of the incident light 24 is reduced, and the sensitivity of the photodiode may be improved.

To implement colonization, the organic light emitting layer 9 may be a red light emitting layer, a blue light emitting layer, or a green light emitting layer. When the multiple OLEDs comprise a red-light OLED, a green-light OLED, and a blue-light OLED, a transparent thin film encapsulation layer 11, instead of glass cover encapsulation, is formed on the transparent cathode layer 10, to protect the OLED below. Because the OLED directly emits red, green, and blue light, it does not need a subsequent color filter or glass cover encapsulation, and the thin film encapsulation layer 11 is directly used to cover the OLED for protection, thereby further improving the light emitting efficiency of the OLED and the sensitivity of the photodiode, simplifying the process, and improving the reliability.

The schematic sectional view of one single light emitting sub-pixel (the organic light emitting layer) and one single light sensing unit (the photodiode) is described above. When multiple light emitting sub-pixels and light sensing units are arranged, a pixel matrix of the image transceiving device is formed.

A mask or laser transferring may be used for patterning of multiple organic light emitting layers in the multiple OLEDs on the substrate. Preferably, a PDMS elastomer is used to form a shadow mask, and the size of an opening of the shadow mask is defined by a photoresist pattern. In a typical solution, the PDMS and the substrate are closely combined, and the size of the formed pattern of the organic light emitting layer is as small as 5 μm.

In a CMOS-driven OLED image transceiving device in the present embodiment, an organic light emitting layer of an OLED is formed by using an exposure splicing manner. An effective area of the image transceiving device is defined to comprise a display area where the organic light emitting layer of the OLED is located and a light sensing area where the photodiode is located and that is for image sensing. The effective area is corresponding to an area where the pixel matrix is located. Preferably, the width-length ratio of the pixel matrix is 4:3, and the diagonal size is larger than 1.2 inches.

Specifically, a large-size silicon substrate, such as the foregoing OLED image transceiving device with a large-size (larger than 1.2 inches) pixel matrix, may be implemented through multiple exposures by using a proper pixel matrix layout design and exposure field splicing. During exposure, an effective area of the substrate is split into several effective areas for separate exposure. Each effective area obtained after splitting is in a light field range of a stepping exposure system. In a specific implementation process, a set of mask plates is separately used to expose units obtained after splitting, and then the substrate is moved in a stepping manner to a next location for a second exposure. In this way, different mask plates are used for different exposure areas, and an alignment system of the exposure system is used to implement splicing, to finally complete exposure in an effective area range of the entire image transceiving device. The method of dividing an effective area into several effective areas for separate exposure helps form an image transceiving device having an effective area of which the diagonal size is above 1.2 inches, for example, 1.2 inches to 2 inches.

Figure 2:
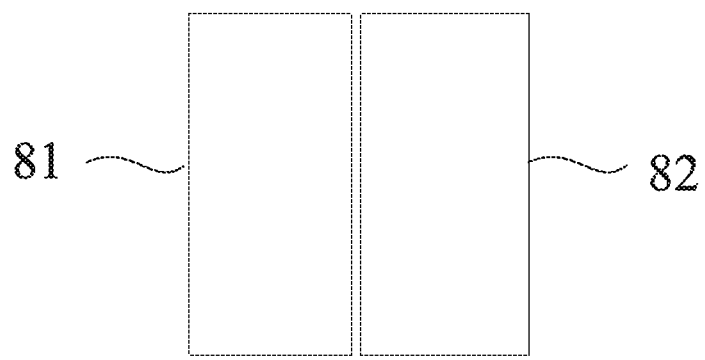
FIG. 2 is a schematic diagram of an effective area obtained through division when an OLED image transceiving device is exposed according to embodiment 1 of the present application.

In this embodiment, as shown in FIG. 2, the effective area of the image transceiving device is vertically divided into two parts: a first effective area 81 and a second effective area 82. An exposure splicing method is used to form a completely spliced effective area.

Figure 3:
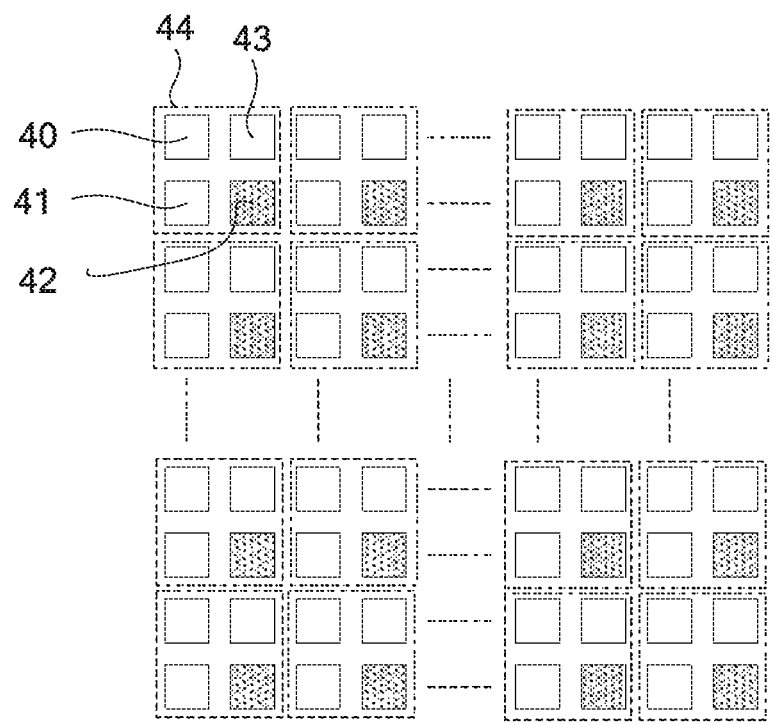
FIG. 3 is a schematic diagram of a pixel layout of an effective area in an OLED image transceiving device according to embodiment 1 of the present application.

After exposure, a hole transport layer is formed on the effective area of the entire substrate. As shown in FIG. 3, FIG. 3 is a schematic diagram of a layout of the pixel matrix of the effective area according to this embodiment. The pixel matrix comprises multiple pixel subunits. Each pixel subunit 44 is designed to be a square, and comprises a red sub-pixel 40, a green sub-pixel 43, a blue sub-pixel 41, and a light sensing unit 42. The red, green, and blue sub-pixels are separately connected to an anode of a corresponding CMOS-driver unit. A PDMS mask plate is used to separately form a red organic light emitting layer, a blue organic light emitting layer, and a green organic light emitting layer in the area of the effective area, which are respectively used as the red sub-pixel 40, the blue sub-pixel 41, and the green sub-pixel 43. A mechanical mask method is used to form the red, blue, and green organic light emitting layers on a corresponding area of the substrate, to form a complete pixel layout of an effective area of an OLED image transceiving device. In this way, the formed large-size image transceiving device also has a color display function.

Then, an electronic transport layer, a transparent conducting layer, and a thin film encapsulation layer are sequentially formed on the substrate, thereby completing the pixel layout of the effective area of the OLED image transceiving device.

Embodiment 2

The difference between the present embodiment and the embodiment 1 lies in: In the present embodiment, four effective areas are obtained through division for exposure, and during exposure, every two effective areas may share a set of mask plates for exposure, thereby reducing manufacture costs.

A monocrystal silicon-based CMOS-driven OLED image transceiving device provided in this embodiment comprises four units. Each unit is a complete OLED image transceiving device, and an effective area of one OLED image transceiving device may reach a maximum of 1 inch. A CMOS substrate of the OLED image transceiving device is formed by using an exposure splicing method. Likewise, by changing the diagonal size of the effective area of the CMOS substrate, a rectangular pixel matrix display screen whose diagonal size is larger than 1.2 inches, for example, in a range of 1.2 inches to 2 inches may be formed.

Figure 4:
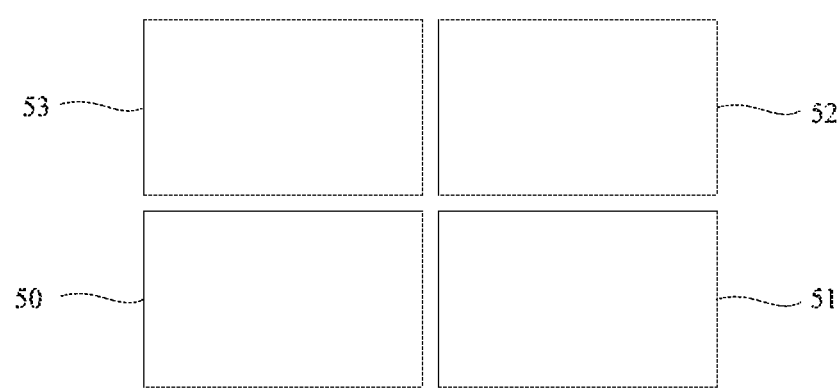
FIG. 4 is a schematic diagram of an effective area obtained through division when an OLED image transceiving device is exposed according to embodiment 2 of the present application.

As shown in FIG. 4, FIG. 4 is a schematic diagram of the effective area of the OLED image transceiving device according to the present embodiment. Four effective areas 50, 51, 52, and 53 of the CMOS substrate are obtained through division for separate exposure. An area of each effective area is designed to be capable of completing exposure in an exposure field. Therefore, the diagonal of each effective area may reach a maximum of 1 inch. Peripheral circuits are separately located at neighboring two sides of the effective area (not shown in the figure). No electronic component is disposed on the other two sides of the effective area that needs to be spliced.

Figure 5:
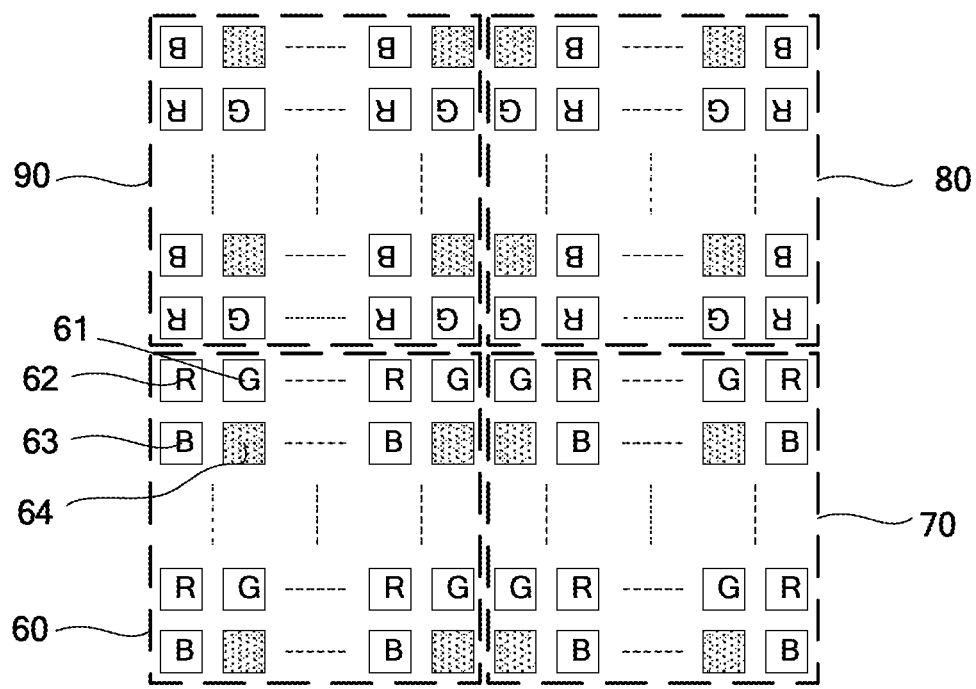
FIG. 5 is a schematic diagram of a pixel layout of an effective area in an OLED image transceiving device according to embodiment 2 of the present application.

A schematic diagram of a layout of a pixel matrix of the effective area of the OLED image transceiving device is shown in FIG. 5. Pixels separately constitute four complete effective areas 60, 70, 80, and 90, which are respectively corresponding to the effective areas 50, 51, 52, and 53 obtained through division on the CMOS substrate.

In the effective area 60 of the OLED image transceiving device, each pixel subunit is constituted by a red sub-pixel 62, a green sub-pixel 61, a blue sub-pixel 63, and a light sensing unit 64, and each pixel subunit is designed to be a square.

Red, blue, and green organic light emitting layers that need to be formed in a corresponding location in the pixel subunits are formed by using a PDMS mask plate. Likewise, no organic light emitting layer is disposed in a location corresponding to the light sensing unit 64, that is, above an area where a photodiode is located.

In a manufacture process, an area where the pixel matrix is located is defined as an effective area which is divided into at least two effective areas for separate exposure, and a spliced effective area is formed by using an exposure splicing method. During specific exposure, the four effective areas 50, 51, 52, and 53 of the CMOS substrate are sequentially exposed respectively.

The effective area 50 of the CMOS substrate is in a light field range of a stepping exposure system, and a set of mask plates is used to expose the effective area 50 of the CMOS substrate. Then, the silicon wafer is moved in a stepping manner to the location of a next exposure field on the diagonally opposite side to the active area 50 for a second exposure, and in the second exposure, the above set of mask plates continues to be used. The location ensures that the formed effective area 52 of the CMOS substrate is rotated by 180° with respect to the effective area 50 of the CMOS substrate. Then, another set of mask plates is used, and the another set of mask plates is bilaterally symmetrical to the former set of mask plates. The silicon wafer is moved in a stepping manner to the location of a next exposure field for a third exposure, and the formed effective area 51 of the CMOS substrate is bilaterally symmetrical to the effective area 50 of the CMOS substrate. Finally, the silicon wafer is moved in a stepping manner to the location of a next exposure field on the diagonally opposite side to the active area 51 for a fourth exposure, and in the fourth exposure, the another set of mask plates continues to be used, and the location ensures that the formed effective area 53 of the CMOS substrate is rotated by 180° with respect to the effective area 51 of the CMOS substrate.

After exposure, next, a hole transport layer is formed on the entire CMOS substrate, and a red organic light emitting layer 62, a blue organic light emitting layer 63, and a green organic light emitting layer 61 are formed in a corresponding location in the effective area 50 of the CMOS substrate by using a PDMS mask plate, to form the effective area 60 of the OLED image transceiving device.

The PDMS mask plate is moved to a location corresponding to the effective area 51 of the CMOS substrate, and red, blue, and green organic light emitting layers are also formed on the effective area 51 of the CMOS substrate by using a mechanical mask splicing method, to form the effective area 70 of the OLED image transceiving device. Manufacturing of red, blue, and green organic light emitting layers in the other two effective areas 52 and 53 are completed by analogy, to respectively form the effective areas 80 and 90 of the OLED image transceiving device.

Then, continuous electronic transport layer, transparent conducting layer, and thin film encapsulation layer are formed, to complete four complete pixel layouts of the effective areas 60, 70, 80, and 90 of the OLED image transceiving device.

The foregoing content is further detailed descriptions of the present application with reference to specific preferred embodiments, and it cannot be considered that embodiments of the present application are only limited to these descriptions. For a person with ordinary skill in the art of the present application, several replacements or obvious variations made without departing from the idea of the present application and having same performance or application should be considered to fall within the protection scope of the present application.

What is claimed is:

1. A silicon-based OLED image transceiving device, comprising:
   a substrate,
   multiple photodiodes for sensing light, and
   multiple OLEDs for emitting light,
   wherein the OLED comprises:
      a metal interconnect anode,
      a hole transport layer,
      an organic light emitting layer,
      an electronic transport layer, and
      a transparent cathode layer;
      wherein the hole transport layer, the organic light emitting layer, the electronic transport layer, and the transparent cathode layer are sequentially formed on the metal interconnect anode;
      wherein the organic light emitting layer is only located on an area corresponding to the metal interconnect anode, and does not extend to an area corresponding to the photodiode; and wherein the multiple photodiodes and organic light emitting layers of the multiple OLEDs are arranged to form a pixel matrix of the image transceiving device, wherein the pixel matrix comprises multiple pixel subunits, each pixel subunit is designed to be a square and comprises a red sub-pixel, a green sub-pixel, a blue sub-pixel, and a light sensing unit the red sub-pixel, the green sub-pixel, and the blue sub-pixel are all light emitting layers of the OLED, and the light sensing unit is the photodiode; and wherein a layout of four pixel areas of the pixel matrix is as follows: a first pixel area is bilaterally symmetrical to a third pixel area, and the first pixel area is coincide with a second pixel area when the first pixel area is rotated by 180°, the third pixel area is coincide with a fourth pixel area when the third pixel area is rotated by 180°.

2. The silicon-based OLED image transceiving device according to claim 1, wherein the OLED further comprises a thin film encapsulation layer, and the thin film encapsulation layer is disposed on the transparent cathode layer.

3. The silicon-based OLED image transceiving device according to claim 1, wherein the width-length ratio of the pixel matrix is 4:3.

4. The silicon-based OLED image transceiving device according to claim 1, wherein the diagonal size of the pixel matrix is larger than 1.2 inches.

5. A manufacture method of a silicon-based OLED image transceiving device according to claim 1, comprising steps of forming one of the multiple photodiodes and one of the multiple OLEDs on the substrate, wherein in the step of forming one of multiple OLEDs, the hole transport layer, the organic light emitting layer, the electronic transport layer, and the transparent cathode layer are sequentially formed on the metal interconnect anode, wherein the pixel matrix comprises multiple pixel subunits, each pixel subunit is designed to be a square and comprises a red sub-pixel, a green sub-pixel, a blue sub-pixel, and a light sensing unit the red sub-pixel, the green sub-pixel, and the blue sub-pixel are all light emitting layers of the OLED, and the light sensing unit is the photodiode;

wherein a layout of four pixel areas of the pixel matrix is as follows: a first pixel area is bilaterally symmetrical to a third pixel area, and the first pixel area is coincide with a second pixel area when the first pixel area is rotated by 180°, the third pixel area is coincide with a fourth pixel area when the third pixel area is rotated by 180°;

wherein a specific step of forming the organic light emitting layer of the OLED comprises: dividing an area in which a pixel matrix of the substrate is located into four pixel areas for separate exposure, forming a spliced pixel area by using an exposure splicing method, next forming the hole transport layer on the pixel area of the entire substrate, and then forming a red organic light emitting layer, a green organic light emitting layer, and a blue organic light emitting layer on each pixel area of the substrate by using a PDMS mask splicing method; and during exposure, all the four pixel areas are in a light field range of an exposure system, and a first set of mask plates is used to expose the first pixel area; then, the substrate is moved to a location of a second exposure field, and the first set of mask plates continues to be used for a second exposure; the location of the second exposure field ensures that the second pixel area of the substrate formed is rotated by 180° with respect to the first pixel area of the substrate; next, the substrate is moved to a location of a third exposure field, and a second set of mask plates is used for a third exposure; the second set of mask plates is bilaterally symmetrical to the first set of mask plates, and the location of the third exposure field ensures that the third pixel area of the substrate formed is bilaterally symmetrical to the first pixel area of the substrate; finally, the substrate is moved to a location of a fourth exposure field, and the second set of mask plates continues to be used for a fourth exposure; and the location of the fourth exposure field ensures that the fourth pixel area of the substrate formed is rotated by 180° with respect to the third pixel area of the substrate.

6. The manufacture method of a silicon-based OLED image transceiving device according to claim 5, wherein after the OLED is formed, the method further comprises a step of forming a thin film encapsulation layer on the transparent cathode layer.

* * * * *